United States Patent [19]
Yoshioka

[11] Patent Number: 5,515,005
[45] Date of Patent: May 7, 1996

[54] OPERATIONAL AMPLIFIER

[75] Inventor: Naoto Yoshioka, Nagaokakyo, Japan

[73] Assignee: Murata Manufacturing Co., Ltd., Japan

[21] Appl. No.: 280,716

[22] Filed: Jul. 26, 1994

[30] Foreign Application Priority Data

| Jul. 27, 1993 | [JP] | Japan | 5-184824 |
| Jul. 27, 1993 | [JP] | Japan | 5-184825 |
| Aug. 5, 1993 | [JP] | Japan | 5-194868 |
| May 24, 1994 | [JP] | Japan | 6-109842 |

[51] Int. Cl.$^6$ .................................................. H03F 3/45
[52] U.S. Cl. ..................... 330/255; 330/257; 330/260; 330/265; 330/294
[58] Field of Search ........................ 330/255, 257, 330/260, 265, 267, 294

[56] References Cited

U.S. PATENT DOCUMENTS

| 4,827,223 | 5/1989 | Gross | 330/267 |
| 5,291,149 | 3/1994 | Nunoshima | 330/255 |
| 5,351,012 | 9/1994 | Toumazou | 330/265 X |
| 5,399,991 | 3/1995 | Moraveji | 330/257 X |

FOREIGN PATENT DOCUMENTS

| 23246 | 2/1977 | Japan | 330/255 |

*Primary Examiner*—James B. Mullins
*Attorney, Agent, or Firm*—Ostrolenk, Faber, Gerb & Soffen

[57] ABSTRACT

An operational amplifier includes a pair of current mirror circuits and a buffer circuit commonly connected to outputs of the pair of current mirror circuits and a first current source. The first current source is electrically connected to the current mirror circuits so as to be controlled by operating currents of the current mirror circuits.

26 Claims, 14 Drawing Sheets

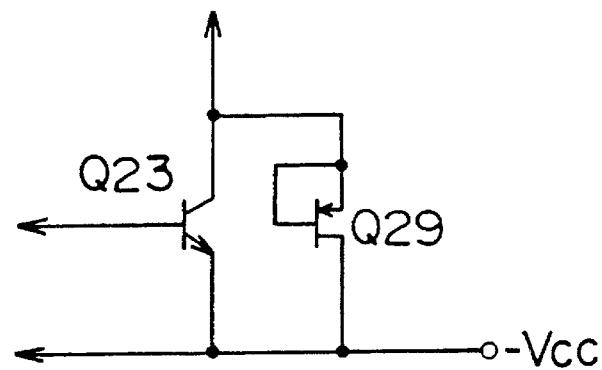
FIG. 10 A
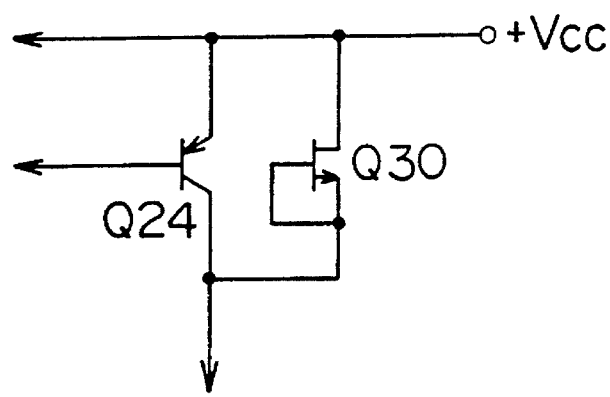
FIG. 10 B
FIG. 11
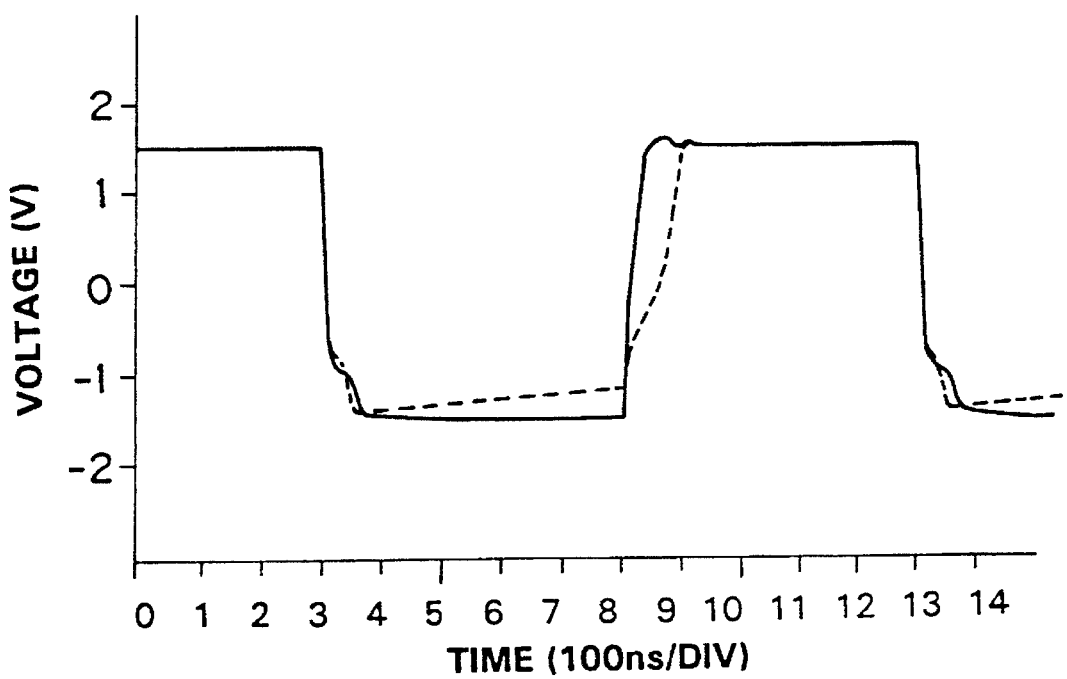

OPERATIONAL AMPLIFIER

BACKGROUND OF THE INVENTION

1. Field of the Invention

The present invention relates generally to an operational amplifier, and more particularly, to an operational amplifier for use in portable communication equipment, for example.

2. Description of the Prior Art

As one example of conventional operational amplifiers, an operational amplifier having a construction disclosed in U.S. Pat. No. 5,291,149 is illustrated in FIG. 1. An operational amplifier 10 comprises a differential amplifying stage 1 and a current mirror stage 2. The differential amplifying stage 1 has first and second differential amplifier circuits 1a and 1b symmetrically disposed, and the current mirror stage 2 has first and second current mirror circuits 2a and 2b symmetrically disposed. A buffer circuit 3 is connected to a common output of the current mirror circuits 2a and 2b.

The first differential amplifier circuit 1a is constituted by a pair of NPN transistors Q1 and Q2, while the second differential amplifier circuit 1b is constituted by a pair of PNP transistors Q4 and Q5.

The first current mirror circuit 2a is constituted by three PNP transistors Q7, Q8 and Q9, while the second current mirror circuit 2b is constituted by three NPN transistors Q10, Q11, and Q12.

The transistors Q1 and Q4 in the first and second differential amplifier circuits 1a and 1b, respectively, have their bases commonly connected to a positive phase input terminal $IN_1$, and the other transistors Q2 and Q5, respectively, have their bases commonly connected to a negative phase input terminal $IN_2$. In addition, the collector of the transistor Q1 forms an output terminal of the first differential amplifier circuit 1a and is connected to an input portion of the first current mirror circuit 2a. The transistor Q2 has its collector connected to a positive power supply terminal. The transistors Q1 and Q2, respectively, have their emitters commonly connected to a first constant current circuit 4a. A collector of the transistor Q4 forms an output terminal of the second differential amplifier circuit 1b and is connected to an input portion of the second current mirror circuit 2b. The collector of the transistor Q5 is connected to a negative power supply terminal. The transistors Q4 and Q5, respectively, have their emitters commonly connected to a second constant current circuit 4b. The first and second constant current circuits 4a and 4b can each be constituted by junction type FETs (Field Effect Transistors), for example.

The respective collectors of the transistors Q9 and Q12 form output terminals of the first and second current mirror circuits 2a and 2b and are commonly connected to an input portion of the buffer circuit 3. In addition, the collector of the transistor Q9 is connected to the positive power supply terminal through a phase compensating capacitor C1, and the collector of the transistor Q12 is connected to the negative power supply terminal through a phase compensating capacitor C2. Further, the buffer circuit 3 is constituted by an emitter follower circuit, for example, and an input impedance existing inside the buffer circuit 3 functions as a load impedance $Z_0$ on the first and second current mirror circuits 2a and 2b.

In the operational amplifier 10, operating currents of the first and second current mirror circuits 2a and 2b are determined by collector currents of the transistors Q1 and Q4 in the first and second differential amplifier circuits 1a and 1b. Consequently, a current corresponding to an input signal voltage flows in the load impedance $Z_0$. Accordingly, stable output characteristics are obtained without being affected by the variation in power supply voltage and the change in temperature, and the operational amplifier 10 can be operated at a relatively low current.

In order to further cope with lower current consumption, however, it is necessary that the operational amplifier 10 be capable of operating at a lower current. An operational amplifier 20 shown in FIG. 2 has been proposed to meet such a demand. In the operational amplifier 20, a diamond-type buffer circuit 13 comprising transistors Q21, Q22, Q25 and Q26 is constructed, and constant current circuits 5a and 5b are respectively used as current sources of the transistors Q21 and Q22.

However, even lower current consumption is necessary because portable communication equipment and the like have been rapidly miniaturized in recent years. Consequently, an operational amplifier which can be operated at a very small current is greatly needed. If the above described operational amplifier 20 is operated at a very small current, however, the response characteristics of an output waveform to an input waveform are degraded. Particularly, the slew rate is low in a rise portion of the waveform, so that the rise time is long, while the settling time of the waveform is long in a fall portion of the waveform, causing waveform distortion. If the operational amplifier 20 being low in waveform response characteristics is used to perform signal processing, the signal processing cannot be performed at high speed, thereby making it difficult to improve communication performance.

On the other hand, if in the operational amplifier, a signal passes through an amplifier circuit, phase delay generally occurs between an input signal and an output signal. The phase delay may, in some cases, reach at least 180° in a high frequency region. If such an operational amplifier is used in a negative feedback circuit, positive feedback occurs, causing oscillation at a frequency at which the gain is not less than 0 dB and the phase delay is 180°. If the phase delay does not reach 180° but is close to 180°, it is considered that the phase delay reaches 180° due to the variation in the operational amplifier, the temperature characteristics, and a capacitor, a resistor and the like constructed outside the operational amplifier. Consequently, a large phase margin as much as a phase delay=180° must be ensured so as to enhance the stability. The phase margin must generally be approximately 40°.

In the above described operational amplifier 10, therefore, the above described phase compensating capacitors C1 and C2 are connected to the output side of the current mirror stage 2. Specifically, the open loop gain of the operational amplifier 10 is restrained by the capacitors C1 and C2, to make phase compensation such that the gain at a frequency at which the phase delay in a high frequency region is 180° is not more than 0 dB. As a result, the above described phase margin for preventing oscillation is set to a certain degree of magnitude.

Furthermore, as shown in FIG. 3, an operational amplifier 30 in which a phase compensating circuit comprising a series circuit of a capacitor C3 and a resistor R1 is connected between an input and an output of a buffer circuit 3 is also proposed.

However, lower current consumption and higher frequency operation of portable communication equipment and the like is needed because of recent developments in communication equipment. Lower current consumption and wider bandwidth are desperately needed with respect to an operational amplifier used for the portable communication equipment. In the above described conventional operational amplifiers 10, 20 and 30, however, the product of gain and bandwidth is decreased if the operational amplifiers are operated at a low current, while the phase margin is insufficient if wider bandwidth is achieved, thereby increasing the danger of oscillation. Specifically, if an attempt to realize both lower current consumption and wider bandwidth is made, it is very difficult to realize a stable operational amplifier.

SUMMARY OF THE INVENTION

A primary object of the present invention is to provide an operational amplifier which is low in current consumption and is superior in waveform response characteristics.

Another object of the present invention is to provide an operational amplifier which is low in current consumption, is high in the product of gain and bandwidth, and is superior in stability.

In accordance with a general aspect of the present invention, there is provided an operational amplifier which comprises at least one pair of current mirror means and a buffer circuit commonly connected to outputs of the at least one pair of current mirror means and having a first current source and in which the first current source is electrically connected to one pair of current mirror means so as to be controlled by operating currents of the current mirror means.

According to the present invention, the current source for supplying a current to the buffer circuit is controlled by the operating currents of the current mirror means in which a current corresponding to an input signal voltage flows, whereby a supply current to the buffer circuit is changed depending on the change in the input signal voltage. Consequently, the response characteristics of an output waveform to an input waveform are enhanced. Specifically, even in the case of very small operating currents, the response characteristics of the output waveform are enhanced, and waveform distortion is improved. If the operational amplifier according to the present invention is used for portable communication equipment and the like, therefore, it is possible to reduce the power consumption of the portable communication equipment and the like.

In addition, two pairs of current mirror means may be provided. In such a case, one pair of current mirror means are connected to the first current source, while another pair of current mirror means are connected to the buffer circuit.

In accordance with another aspect of the present invention, there is provided an operational amplifier comprising a pair of current mirror means and a buffer circuit commonly connected to outputs of the pair of current mirror means and having first and second pairs of current sources.

In the case, such a operational amplifier is preferably constructed so that there is provided a bias circuit connected between a positive power supply terminal, which is connected to a positive power voltage, and a negative power supply terminal, which is connected to a negative power voltage or a ground potential, and at least one pair of current sources out of the first and second pairs of current sources has a current control circuit receiving an output of the bias circuit for controlling an operating current of the buffer circuit.

Furthermore, in accordance with a particular aspect of the present invention, the operational amplifier is constructed so that the first pair of current sources out of the first and second pairs of current sources is connected to the current mirror means so as to be controlled by operating currents of the current mirror means, while the second pair of current sources has the current control circuit.

In such a construction where the buffer circuit has the first and second current sources, both a predetermined current and a current corresponding to an input waveform flow in the buffer circuit, the response characteristics of an output waveform to the input waveform are enhanced. More specifically, if two types of current sources, that is, a current source for controlling a current flowing in the buffer circuit by the operating currents of the current mirror means and a current source different from the first mentioned current source are used as the first and second current sources, respectively the current is supplied to the buffer circuit by the two types of current sources. Consequently, the current corresponding to the input waveform is supplied to the buffer circuit so that the response characteristics of the output waveform are enhanced, and a current other than the input current is supplied thereto so that the output driving capability can be enhanced. Accordingly, it is possible to obtain an operational amplifier which is increased in the slew rate, is improved in the sap of the waveform, and is low in waveform distortion.

In accordance with still another aspect of the present invention, there is provided an operational amplifier comprising a pair of differential amplification means each having positive and negative input terminals, a pair of current mirror means connected to the pair of differential amplification means so that outputs of the differential amplification means are applied thereto, a buffer circuit commonly connected to outputs of the pair of current mirror means, a first capacitor and first and second resistors connected between an input and an output of the buffer circuit and connected in series with each other, and a second capacitor connected between a node of the first resistor and the second resistor and a power supply.

In accordance with yet still another aspect of the present invention, there is provided an operational amplifier comprising a pair of differential amplification means each having positive and negative input terminals, a pair of current mirror means electrically connected to the pair of differential amplification means so that outputs of the differential amplification means are applied thereto, a buffer circuit commonly connected to outputs of the pair of current mirror means, first and second resistors and a first capacitor connected between an input and an output of the buffer circuit, the first resistor being connected in series with the second resistor through the first capacitor, a second capacitor connected between a node of the first resistor and the first capacitor and a power supply, and a third resistor and a third capacitor connected between a node of the first capacitor and the second resistor and the power supply and connected in series with each other.

In accordance with a further aspect of the present invention, there is provided an operational amplifier comprising a pair of differential amplification means each having positive and negative input terminals, a pair of current mirror means connected to the pair of differential amplification means so that outputs of the differential amplification means are applied thereto, a buffer circuit commonly connected to outputs of the pair of current mirror means, a first capacitor and a first resistor connected between an input and an output of the buffer circuit and connected in series with each other, and a series circuit connected between at least one of the input and the output of the buffer circuit and a power supply and having a second resistor and a second capacitor.

In accordance with a still further aspect of the present invention, there is provided an operational amplifier comprising a pair of differential amplification means each having positive and negative input terminals, a pair of current mirror means connected to the pair of differential amplification means so that outputs of the differential amplification means are applied thereto, a buffer circuit commonly connected to outputs of the pair of current mirror means, a first capacitor and a first resistor connected between an input and an output of the buffer circuit and connected in series with each other, and a series circuit connected between a node of the first capacitor and the first resistor and a power supply and having a second resistor and a second capacitor.

In the operational amplifier according to the present invention comprising the first resistor and the first capacitor connected in series with each other between the input and the output of the buffer circuit, if a capacitive load is connected to the output of the buffer circuit, so that phase delay can occur, that is, the phase margin of the operational amplifier can be decreased, the gain in a high frequency region is reduced by the first resistor, the first capacitor and the second registor, whereby the above described phase margin is ensured.

Furthermore, as viewed from the input of the buffer circuit, the capacitor is connected to the power supply through the resistor. Accordingly, the open loop gain of the operational amplifier is restrained, and phase compensation is made such that the gain at a frequency at which phase delay in the high frequency region is 180° is not more than 0 dB, whereby the phase margin for preventing oscillation is ensured.

Additionally, as viewed from the output of the buffer circuit, the capacitor is connected to the power supply through the resistor. Accordingly, the impedance is increased in a required frequency band, so that the gain is not lowered. On the other hand, the impedance is decreased in a frequency band higher than the required frequency band, so that the pain can be decreased.

In accordance with a yet still further aspect of the present invention, there is provided an operational amplifier comprising a pair of current mirror means, and a diamond-type buffer circuit commonly connected to outputs of the pair of current mirror means, the buffer circuit having in its input stage a transistor having an emitter terminal, a collector terminal and a base terminal, and a capacitor connected between the base terminal and the emitter terminal of the transistor.

In the present invention, the capacitor is connected between the base terminal and the emitter terminal of the transistor in the input stage of the buffer circuit as described above, whereby it is possible to enhance the response characteristics of the output waveform to the input waveform by causing a current corresponding to the change in voltage at high speed in a transient region of the input waveform to flow into the buffer circuit. In addition, if the current source for supplying the current to the buffer circuit is controlled by the operating currents of the current mirror means in which the current corresponding to the input signal flows, the supply current to the buffer circuit is changed depending on the change in an input signal voltage, thereby to further enhance the response characteristics of the output waveform to the input waveform.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 10A and 10B are circuit diagrams showing second current sources on the side of a negative power supply (FIG. 10A) and a positive power supply (FIG. 10B) in a case where FETs are used as the second current sources in the embodiment shown in FIG. 8;

FIG. 11 is a diagram showing the waveform response characteristics of the operational amplifier according to the fourth embodiment of the present invention, where a solid line indicates the characteristics of the operational amplifier according to the present embodiment, and a broken line indicates the characteristics of the conventional operational amplifier;

DESCRIPTION OF THE PREFERRED EMBODIMENTS

Preferred embodiments will be described with reference to the drawings, to clarify the present invention.

Figure 4:
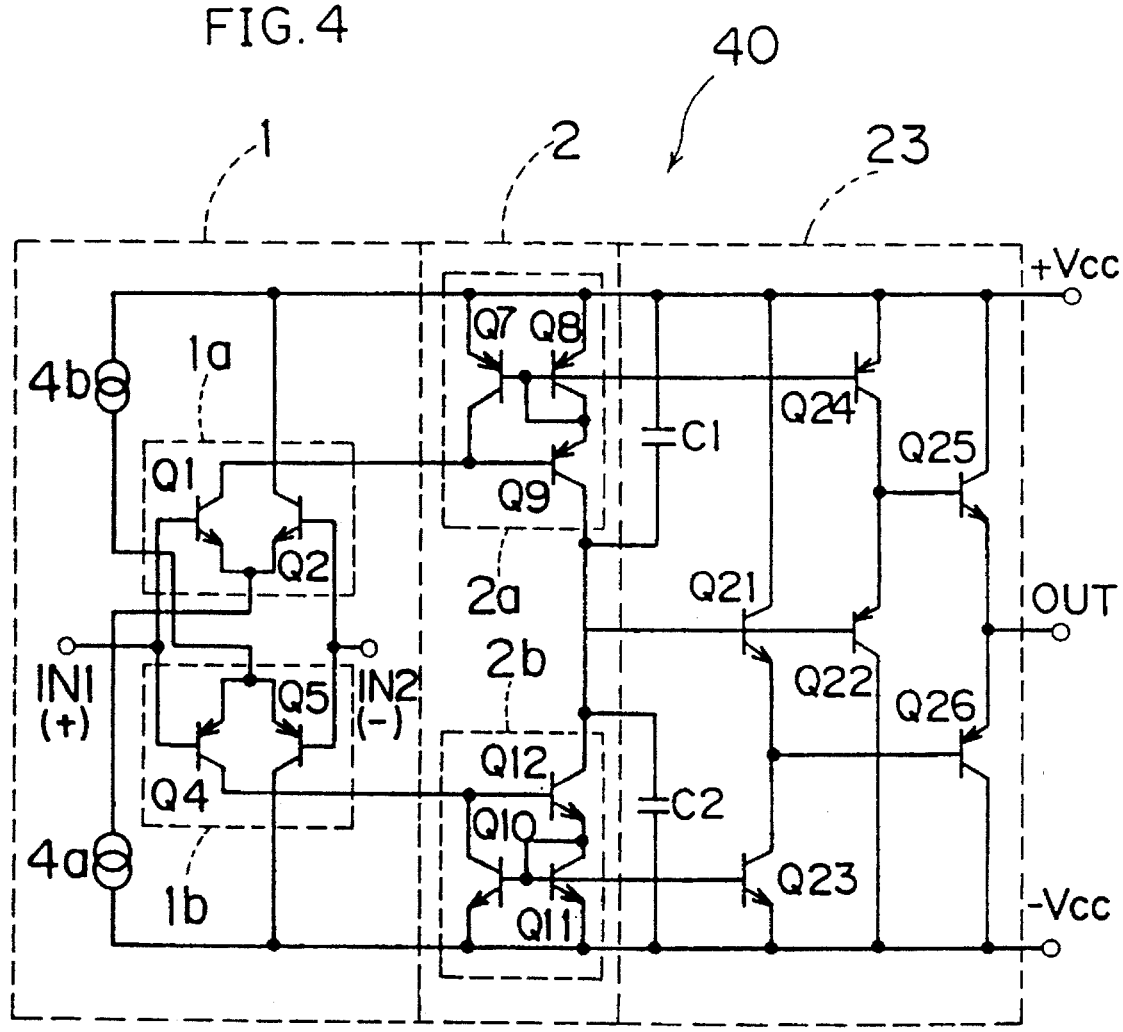
FIG. 4 is a circuit diagram for explaining an operational amplifier according to a first embodiment of the present invention.

A first embodiment is characterized in that a current source for supplying a current to a buffer circuit is controlled by operating currents of a current mirror stage. Specifically, as shown in FIG. 4, an operational amplifier 40 has a differential amplifying stage 1, a current mirror stage 2, and a buffer circuit 23. In the buffer circuit 23, an NPN transistor Q23 has its collector connected to a node of the emitter of a transistor Q21 and the base of a transistor Q26, its emitter connected to a negative power supply terminal, and its base connected to the bases of a transistor Q10 and a transistor Q11 in a second current mirror circuit 2b.

Furthermore, a PNP transistor Q24 has its collector connected to a node of the emitter of a transistor Q22 and the base of a transistor Q25, its emitter connected to a positive power supply terminal, and its base connected to the bases of transistors Q7 and Q8 in a first current mirror circuit 2a.

The differential amplifier stage 1 and the current mirror stage 2 are constructed as in the conventional operational amplifier described with reference to FIG. 1 and hence, the description thereof is omitted by incorporating the description with reference to FIG. 1. The same shall apply in the following embodiments.

In the operational amplifier 40, the transistors Q23 and Q24 serve as current sources in the buffer circuit 23, and operating currents of the transistors Q23 and Q24 are respectively controlled by the current mirror circuits 2a and 2b. In the present embodiment, operating currents of the transistors Q21 and Q22 and base currents of the transistors Q25 and Q26 in the buffer circuit 23 are supplied depending on the change in an input signal voltage, thereby to enhance the response characteristics of an output waveform to an input waveform.

Figure 2:
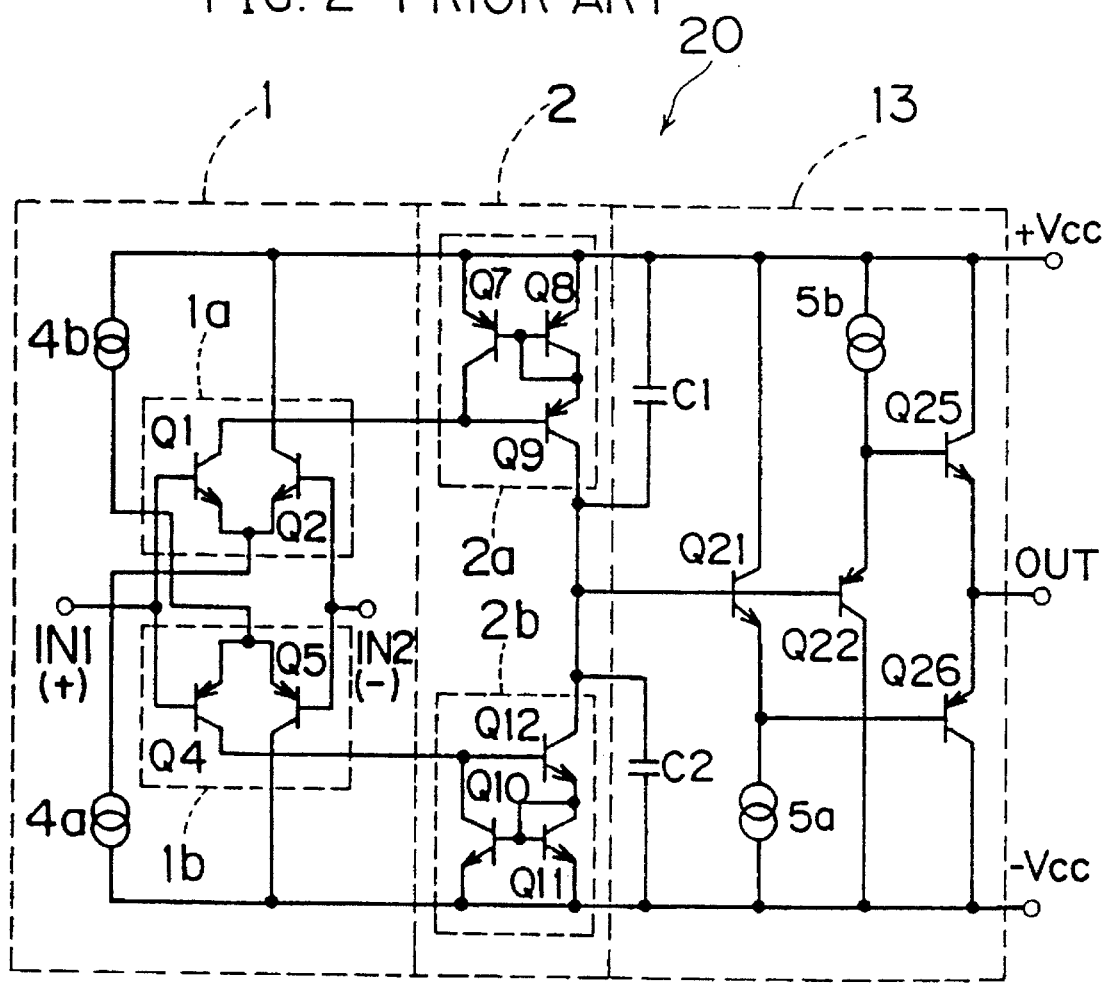
FIG. 2 is a circuit diagram for explaining another example of the conventional operational amplifiers.
Figure 3:
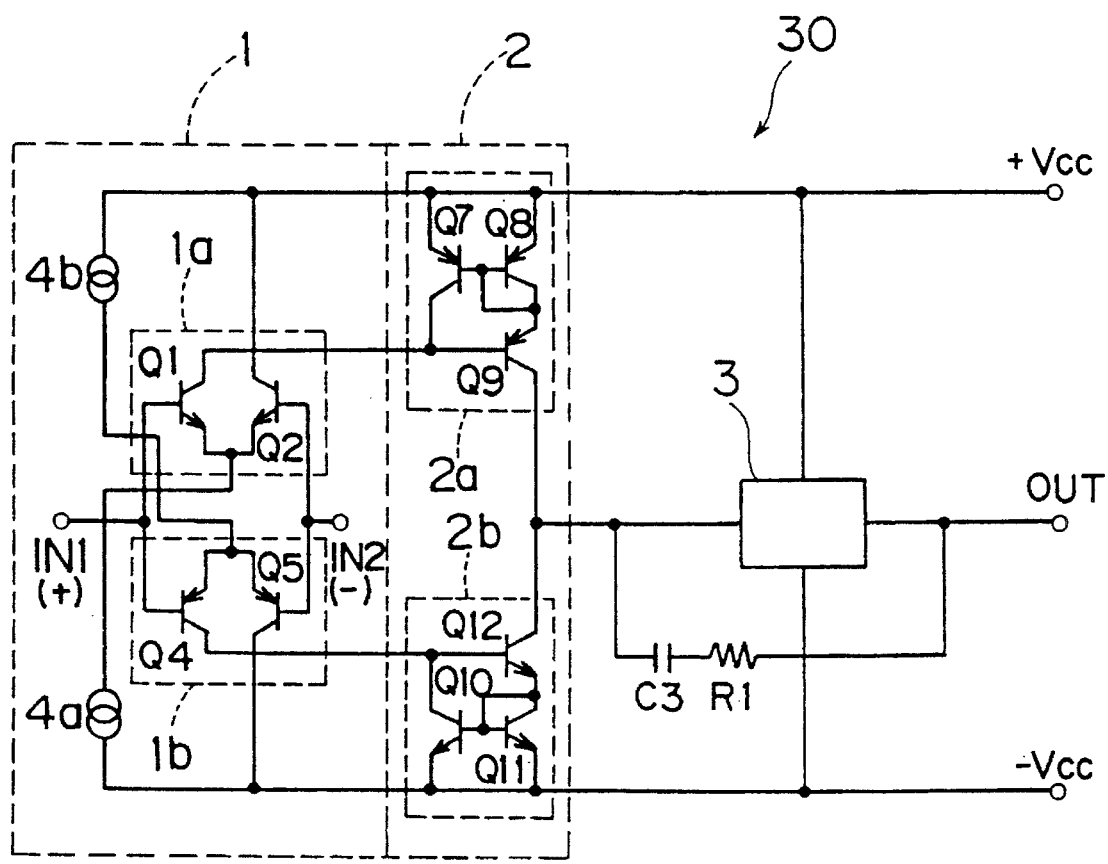
FIG. 3 is a circuit diagram for explaining still another example of the conventional operational amplifiers.
Figure 5:
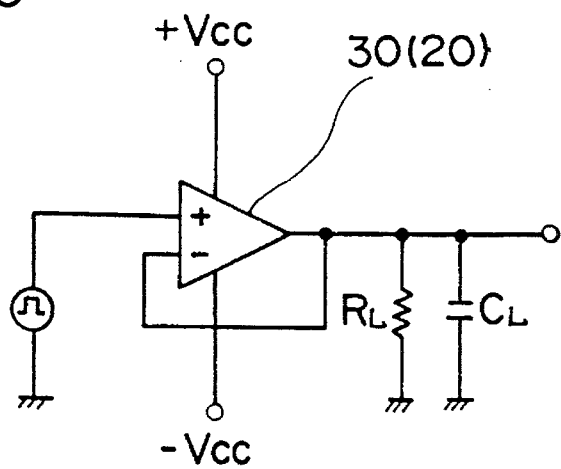
FIG. 5 is a circuit diagram for measuring the waveform response characteristics of the operational amplifier.
Figure 6:
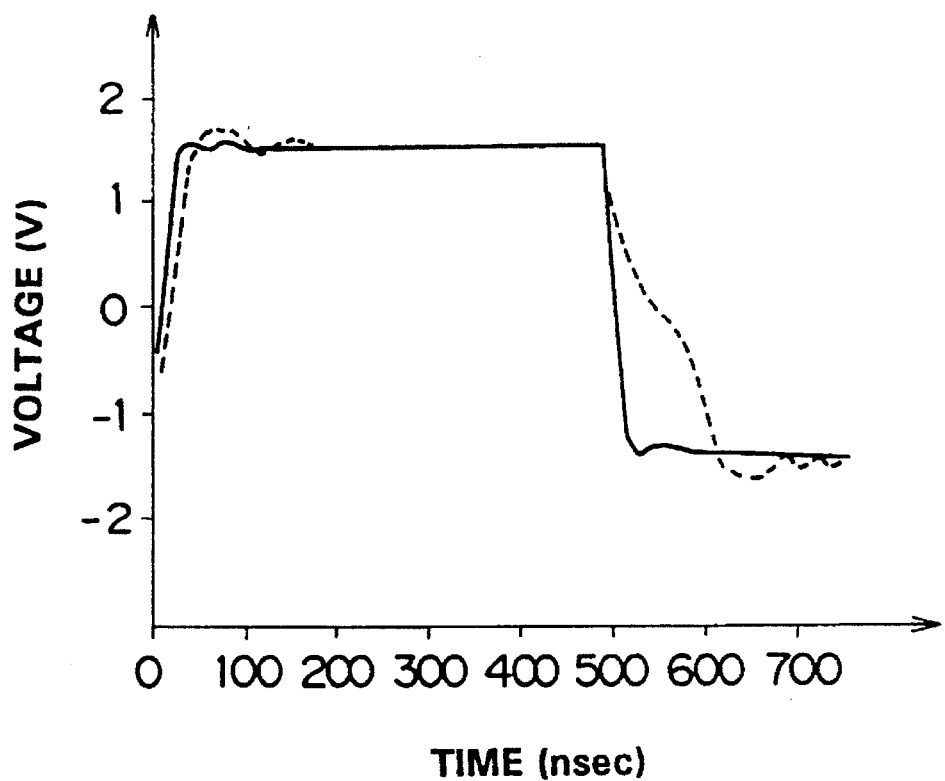
FIG. 6 is a diagram showing the waveform response characteristics of the operational amplifier, where a solid line indicates the characteristics of the operational amplifier according to the first embodiment, and a broken line indicates the characteristics of the conventional operational amplifier.

In order to confirm the effect of the operational amplifier 40 according to the present embodiment, the waveform response characteristics in a case where the operational amplifier 20 in the conventional example shown in FIG. 2 is used and a case where the operational amplifier 40 in the present embodiment is used are simulated using a circuit shown in FIG. 5. The results are shown in FIG. 6. As the conditions of the circuit shown in FIG. 5, a resistor $R_L$ of 2 kΩ and a capacitor $C_L$ of 10 pF are connected in parallel to each of the outputs of the operational amplifiers 20 and 40, the power supply voltage Vcc is set to ±2.5 v, the operating current is set to 0.6 mA, and a rectangular wave of 3 Vpp at 1 MHz is applied to each of inputs of the operational amplifiers 20 and 40.

The characteristics shown in FIG. 6 are obtained by simulating an output waveform of the circuit shown in FIG. 5, where a solid line indicates the characteristics of the operational amplifier 40 in the present embodiment, and a broken line indicates the characteristics of the operational amplifier 20 in the conventional example. The slew rate in a rise portion is 57 V/μsec in the operational amplifier 20 in the conventional example, while being improved to 99 V/μsec in the operational amplifier 40 in the present embodiment. In addition, the time when the waveform converges in a fall portion in the operational amplifier 40 in the present embodiment is much faster than that in the operational amplifier 20 in the conventional example. Consequently, the waveform is hardly deformed, resulting in improved reduction of waveform distortion.

Figure 1:
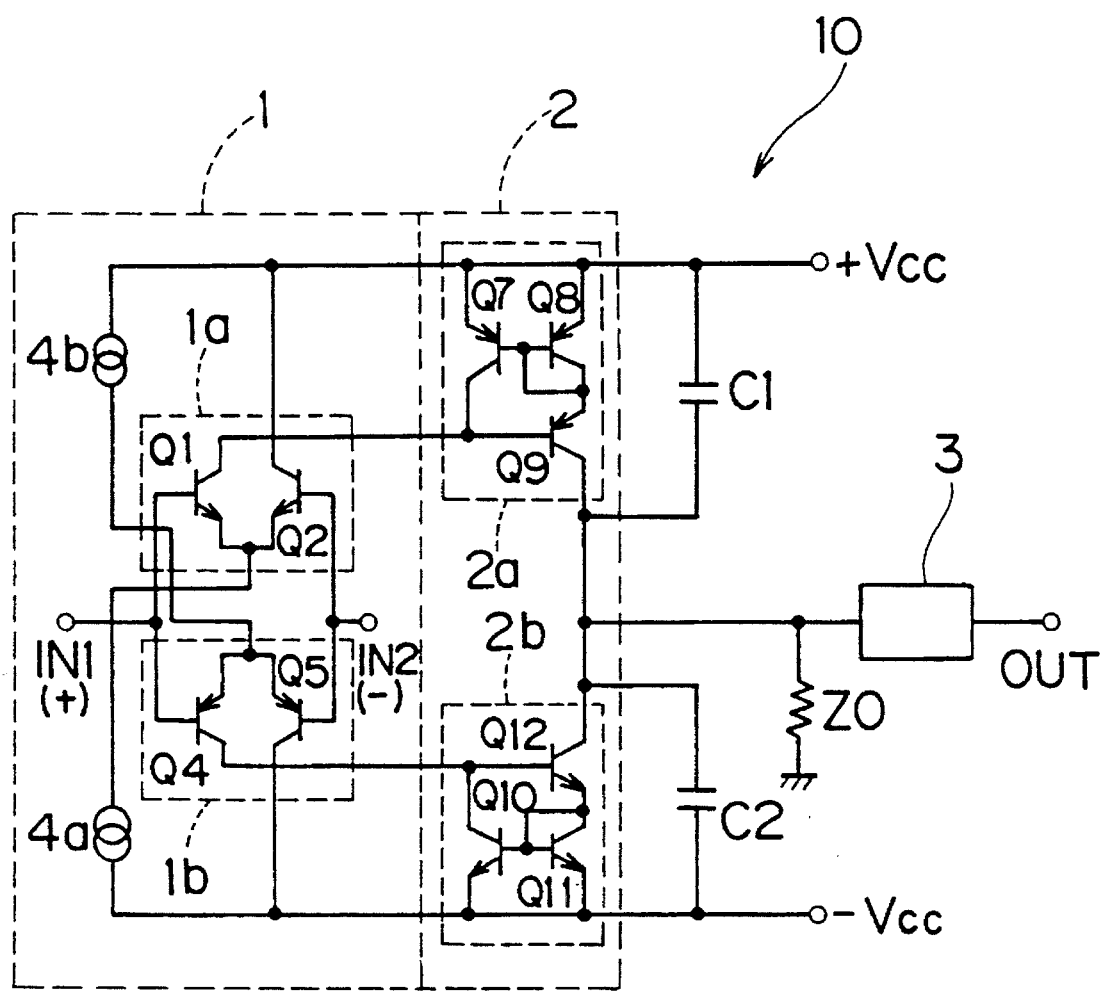
FIG. 1 is a circuit diagram showing one example of conventional operational amplifiers.
Figure 7:
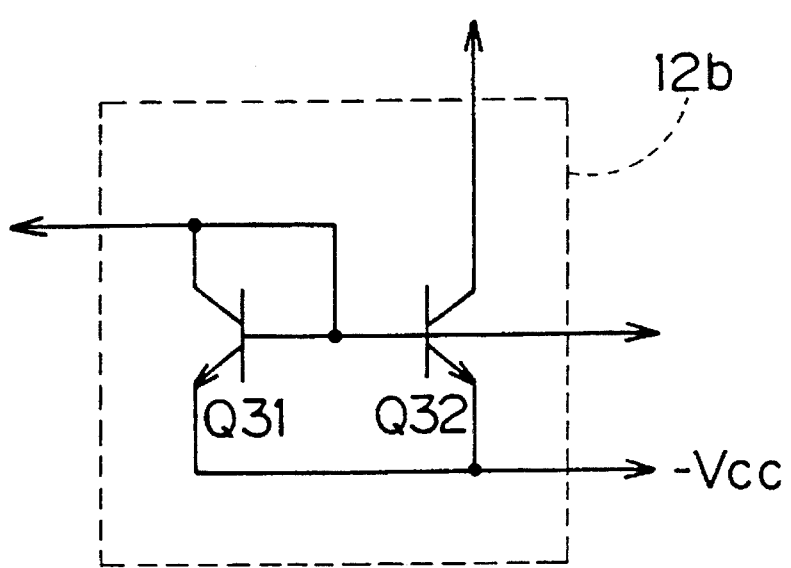
FIG. 7 is a diagram showing a current mirror circuit in a second embodiment of the present invention.

A current mirror circuit in the operational amplifier 40 in the present embodiment is not limited to the current mirror circuits 2a and 2b shown in FIG. 1. Another circuit may be used, provided that it has a current mirror function. For example, a current mirror circuit 12b shown in FIG. 7 may be used as a second embodiment. In the current mirror circuit 12b, the collector and the base of an NPN transistor Q31 and the base of an NPN transistor Q32 are connected to each other, and are connected to the collector of a transistor Q4 in a differential amplifier circuit 1b and the base of a transistor Q23 in a buffer circuit 23. In addition, the transistors Q31 and Q32, respectively, have their emitters connected to a negative power supply terminal, and the transistor Q32 has its collector commonly connected to the bases of transistors Q21 and Q22 in the buffer circuit 23. Although the current mirror circuit 12b corresponding to the current mirror circuit 2b shown in FIG. 1 is illustrated in FIG. 7, a current mirror circuit corresponding to the current mirror circuit 2a can be similarly constructed. In this case, the NPN transistors Q31 and Q32 may be changed into PNP transistors.

Figure 8:
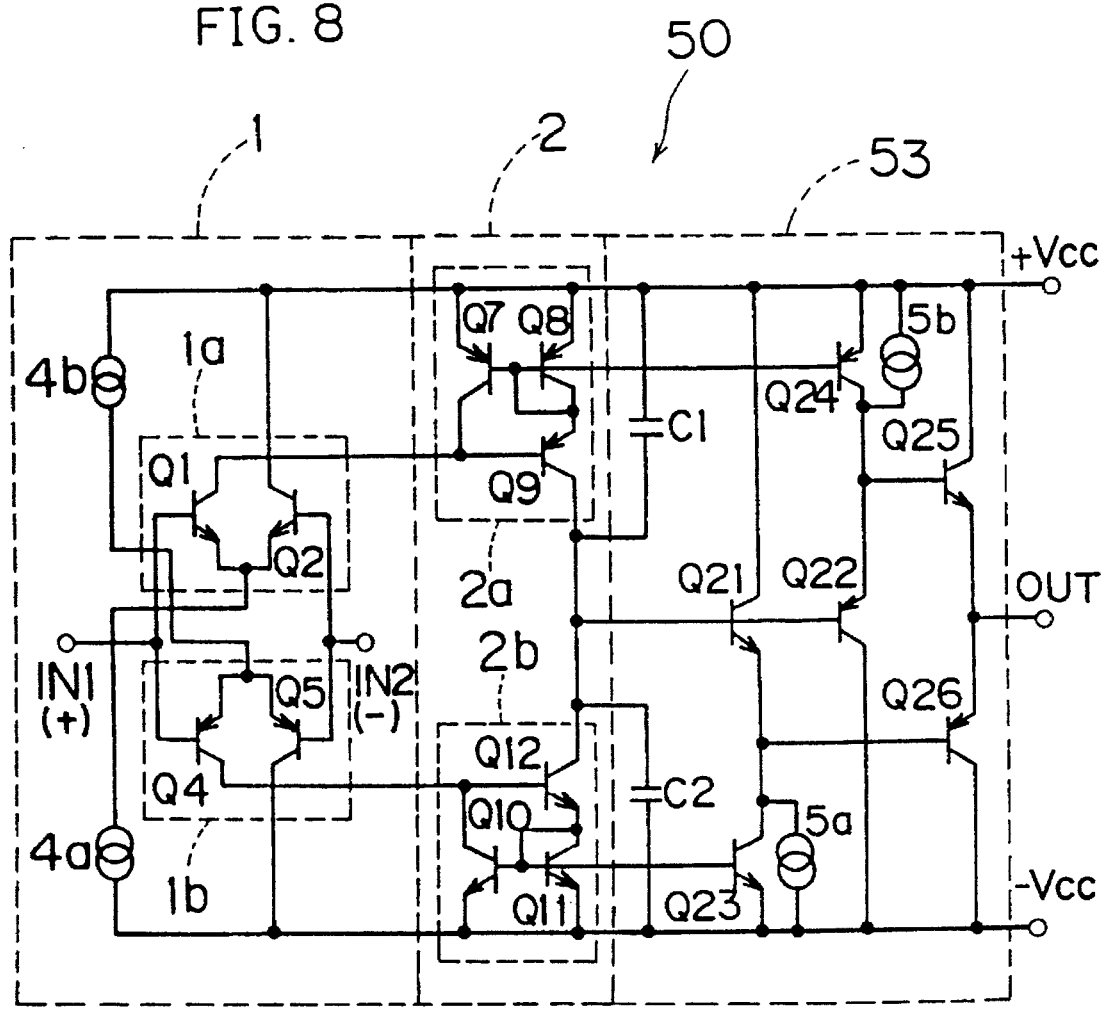
FIG. 8 is a circuit diagram showing an operational amplifier according to a third embodiment of the present invention.

A third embodiment will be described with reference to FIG. 8. The present embodiment is characterized in that two types of current sources, that is, a first current source for controlling a current flowing in a buffer circuit via operating circuits in a current mirror stage and a second current source other than the first current source is used as a current source for supplying a current to the buffer circuit. Specifically, as shown in FIG. 8, second current sources 5a and 5b are respectively connected between the collectors of transistors Q23 and Q24 constituting the first current source in a buffer circuit 53 and a negative power supply terminal and a positive power supply terminal, to constitute an operational amplifier 50.

In the operational amplifier 50 thus constructed, the transistors Q23 and Q24 and the current sources 5a and 5b constitute the current sources in the buffer circuit 53. Operating currents of the transistors Q23 and Q24 are respectively controlled by current mirror circuits 2b and 2a. The transistors Q23 and Q24 respectively supply operating currents of transistors Q21 and Q22 and base currents of transistors Q26 and Q25 in the buffer circuit 53 depending on the change in an input signal voltage, and the current sources 5a and 5b respectively supply operating currents of transistors Q21 and Q22 and base currents of transistors Q26 and Q25 in the buffer circuit 53 independently of the transistors Q23 and Q24. Consequently, the response characteristics of an output waveform to an input waveform are further improved and the output driving capability is enhanced, as compared with those in the operational amplifier in the first embodiment.

Figure 9:
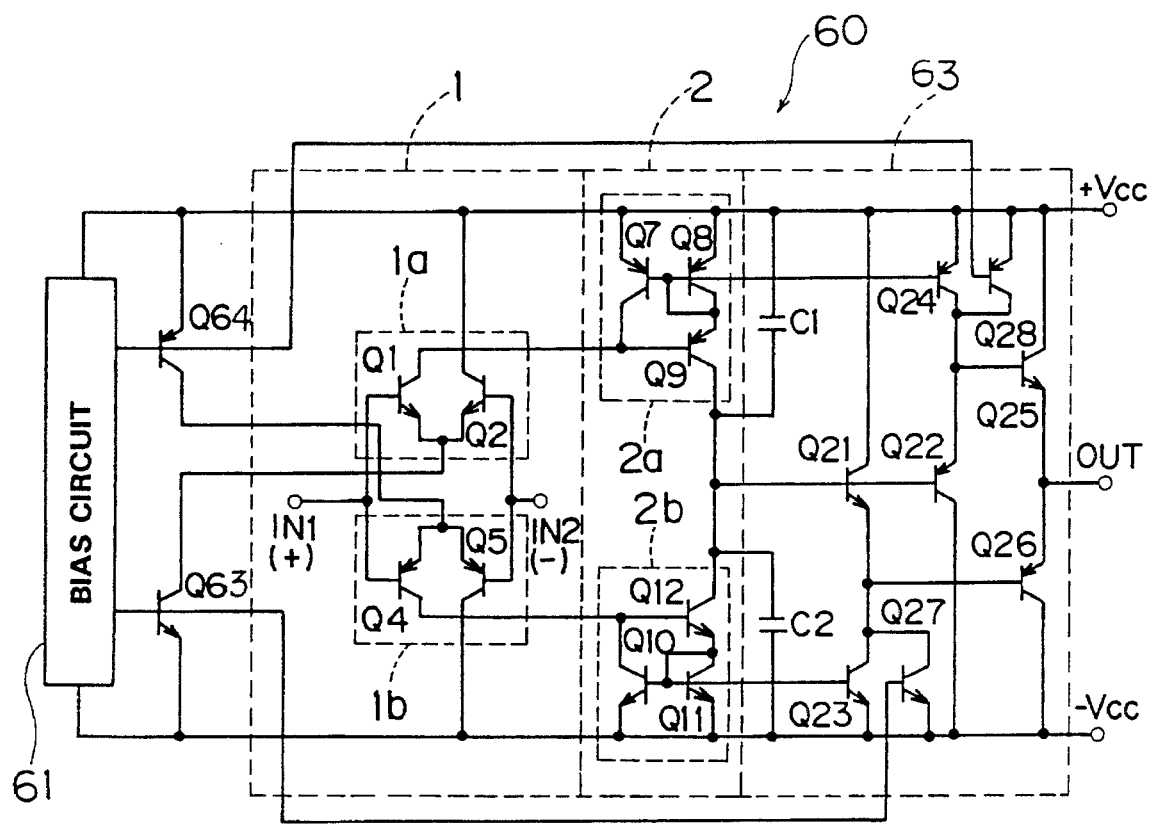
FIG. 9 is a circuit diagram showing an operational amplifier according to a fourth embodiment of the present invention.

FIG. 9 illustrates an operational amplifier 60 according to a fourth embodiment using transistors as current sources 5a and 5b. In FIG. 9, the current source 5a is constructed by connecting the collector of a transistor Q27 to the collector of a transistor Q23, connecting the emitter of the transistor Q27 to a negative power supply terminal and connecting the base of the transistor Q27 to a first output portion of a bias circuit 61 connected between positive and negative power supply terminals. In addition, the current source 5b is constructed by connecting the collector of a transistor Q28 to the collector of a transistor Q24, connecting the emitter of the transistor Q28 to the positive power supply terminal, and connecting the base of the transistor Q28 to a second output portion of the bias circuit 61 connected between the positive and negative power supply terminals. The current sources 5a and 5b control a current flowing in a buffer circuit 63 by the bias circuit 61. Transistors Q63 and Q64 respectively correspond to first and second constant current circuits 4a and 4b shown in FIG. 8.

The operational amplifier 60 thus constructed comprises a first current source for controlling a current flowing in the buffer circuit 63 by operating currents of a current mirror stage 2 and a second current source for controlling the current by the bias circuit 61. Therefore, it is possible to operate the operational amplifier 60 having the desired high-speed capability and output driving capability with at least necessary current consumption.

Furthermore, the current sources 5a and 5b are not limited to the transistors Q27 and Q28. For example, they can be respectively constituted by only resistors or FETs Q29 and Q30, each having its gate connected to a source, as shown in FIGS. 10A and 10B.

In order to confirm the effect of the operational amplifier 60 according to the present embodiment, the waveform response characteristics in a case where the operational amplifier 40 in the first embodiment is used and a case where the operational amplifier 60 in the fourth embodiment is used are simulated using the circuit shown in FIG. 5. The results are shown in FIG. 11. As the conditions of the circuit shown in FIG. 5, a resistor $R_L$ of 2 kΩ and a capacitor $C_L$ of 10 pF are connected in parallel to each of outputs of the operational amplifiers 40 and 60, the power supply voltage Vcc is set to ±2.5 v, and a rectangular wave of 3 Vpp at 1 MHz is applied to each of inputs of the operational amplifiers 40 and 60.

In FIG. 11, a solid line indicates a case where the operational amplifier 60 in the present embodiment is used, and a broken line indicates a case where the operational amplifier 40 in the first embodiment is used. As can be seen from FIG. 11, the slew rate in a rise portion is 26 V/μsec in the operational amplifier 40, while being further improved to 73 V/μsec in the operational amplifier 60 in the present embodiment. In addition, the sag at a low level is improved, and the waveform is hardly deformed, resulting in improved reduction of waveform distortion.

The reason why the slew rate in the operational amplifier 40 in the first embodiment is 99 V/μsec in the description with reference to FIG. 6, while being 26 V/μsec in FIG. 11 is that it is supposed that hfe (&B) of an output transistor in the final stage is remarkably decreased. If the amplitude of an output voltage is increased or the value of load resistance is decreased, a similar result is obtained.

A current consumption in this case is 500 μA in the operational amplifier 40, while being 546 μA in the operational amplifier 60 in the present embodiment, which is only increased by not more than 10%. Moreover, it is found that the characteristics are improved as described above. In order to improve the characteristics to the same degree in the operational amplifier 40, the consumed current must be 670 μA, which is increased by not less than 30%.

Also in the operational amplifiers 50 and 60 according to the third and fourth embodiments, a current mirror circuit is not limited to the current mirror circuits 2a and 2b shown in FIG. 8. The current mirror circuit can be formed as in the first embodiment.

Although illustrated as a phase compensating circuit is one in which capacitors C1 and C2 are respectively connected between the collectors of transistors Q9 and Q12 and the positive and negative power supply terminals, a combination of a capacitor and a resistor, for example, phase compensating circuits in fifth to tenth embodiments as described later may be used, and the circuit can be connected to an arbitrary portion which is effective in phase compensation in addition to the area between the collectors of the transistors Q9 and Q12 and the positive and negative power supply terminals. Further, the operational amplifiers 50 and 60 shown in FIGS. 8 and 9 are basic circuits. In actual use, the operational amplifiers 50 and 60 may, in some cases, be constructed by connecting resistors, diodes and/or transistors to the respective portions.

Figure 12:
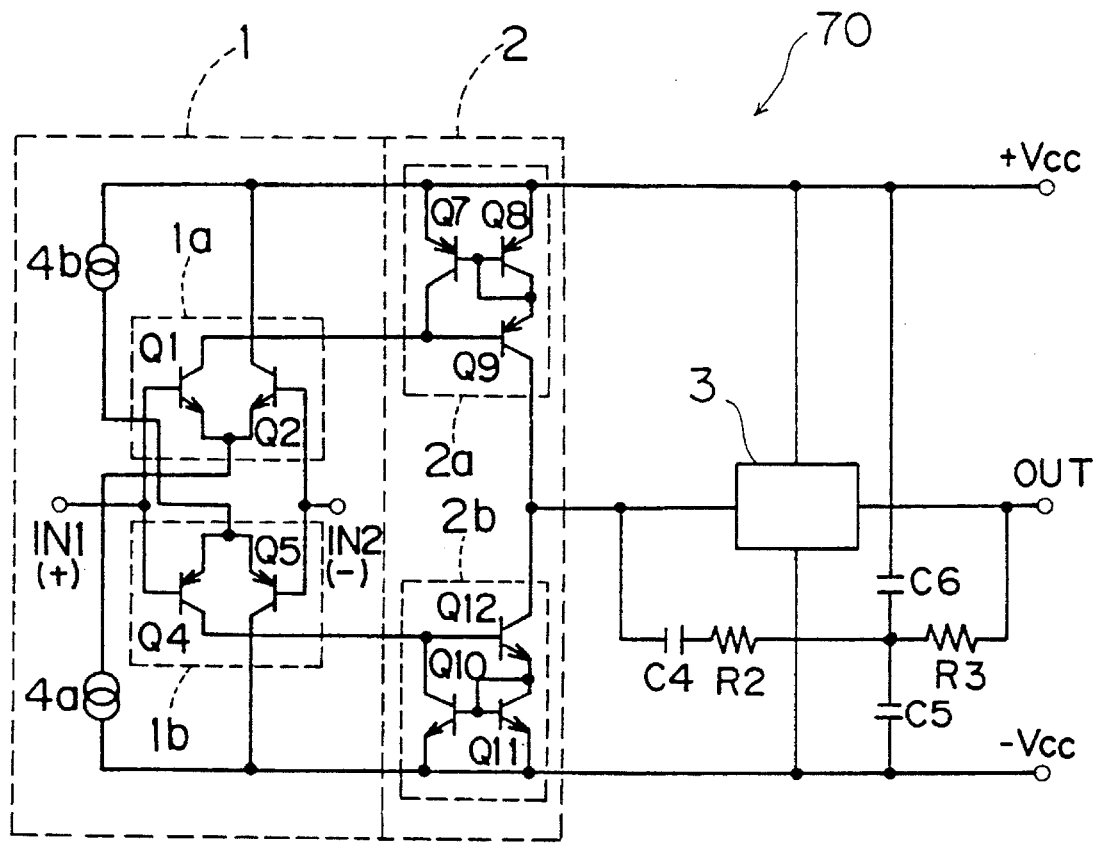
FIG. 12 is a circuit diagram showing an operational amplifier according to a fifth embodiment of the present invention.

A fifth embodiment of the present invention is characterized in that a resistor and a capacitor are connected in series between an input and an output of a buffer circuit, and the capacitor is connected to a power supply terminal through the resistor from the input and the output of the buffer circuit, to constitute a phase compensating circuit. Specifically, as shown in FIG. 12, an operational amplifier 70 comprises a differential amplifying stage 1, a current mirror stage 2 and a buffer circuit 3, and a series circuit of a capacitor C4 and resistors R2 and R3 is connected between an input and an output of the buffer circuit 3. In addition, capacitors C5 and C6 are connected from a node of the resistors R2 and R3 to positive and negative power supply terminals.

The buffer circuit 3 can be constructed similarly to the buffer circuits in the operational amplifiers in the first to fourth embodiments and in the conventional example. The same shall apply in the following sixth to tenth embodiments.

If and when a capacitive load is connected to the output, resulting in phase delay in the operational amplifier 70 shown in FIG. 12 and the phase margin of the operational amplifier 70 can be decreased, an output impedance of the current mirror stage 2, an input impedance of the buffer circuit 3, the capacitor C4, the resistors R2 and R3, and the capacitive load constitute a first low-pass filter, so that the gain of a high frequency region is reduced. As a result, the phase margin of the operational amplifier 70 is ensured.

Furthermore, as viewed from the input of the buffer circuit 3, the output impedance of the current mirror stage 2, the input impedance of the buffer circuit 3, the resistor R2 and the capacitors C5 and C6 through the capacitance of the capacitor C4 constitute a second low-pass filter. Consequently, the first pole frequency of the operational amplifier 70 is adjusted, to produce the effect of phase compensation. Further, as viewed from the output of the buffer circuit 3, an output impedance of the buffer circuit 3, the resistor R3 and the capacitors C5 and C6 constitute a third low-pass filter. The time constant of the third low-pass filter is made smaller than that of the second low-pass filter, thereby to make it possible to further decrease the gain in a frequency band higher than a required frequency band.

The resistors R2 and R3 are connected so as to set the time constant of the first low-pass filter and set the time constants of the second low-pass filter and the third lowpass filter by sharing the capacitors C5 and C6. Even if either one of the capacitors C5 and C6 is omitted, the same effect can be obtained.

In order to confirm the effect of the operational amplifier 70 in the present embodiment, the product of gain and bandwidth and the phase margin in the operational amplifiers 20 and 30 in the conventional examples and the operational amplifier 70 in the present embodiment are simulated. The results are shown in Table 1.

TABLE 1

| | product of gain and bandwidth | phase margin |
|---|---|---|
| conventional operational amplifier 20 | 129 MHz | 40° |
| conventional operational amplifier 30 | 153 MHz | 40° |
| operational amplifier 70 in the present invention | 336 MHz | 30° |
| | 336 MHz | 40° |

As can be seen from Table 1, the operation amplifier 70 in the present embodiment is superior because the product of gain and bandwidth in a case where the phase margin is 40° is 336 MHz which is the highest value.

Figure 13:
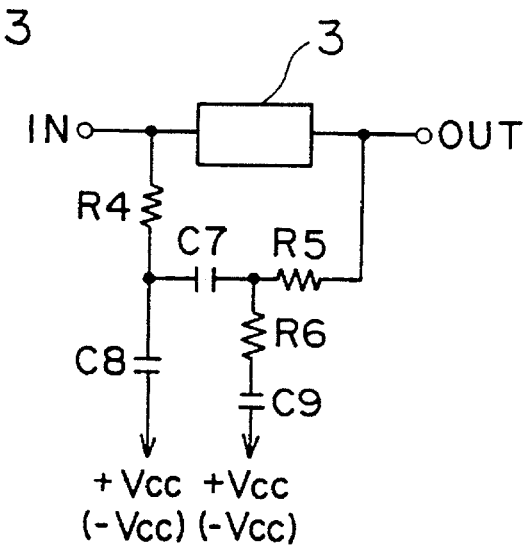
FIG. 13 is a diagram showing a phase compensating circuit in a sixth embodiment.

In addition to the phase compensating circuit shown in FIG. 12, a phase compensating circuit may be constructed by connecting a resistor R4 and a resistor R5 in series through a capacitor C7 between an input and an output of a buffer circuit 3, connecting a capacitor C8 between a node of the resistor R4 and the capacitor C7 and a positive power supply terminal or a negative power supply terminal, and connecting a resistor R6 and a capacitor C9 in series between a node of the capacitor C7 and the resistor R5 and the positive power supply terminal or the negative power supply terminal, as shown as a sixth embodiment in FIG. 13.

Figure 14:
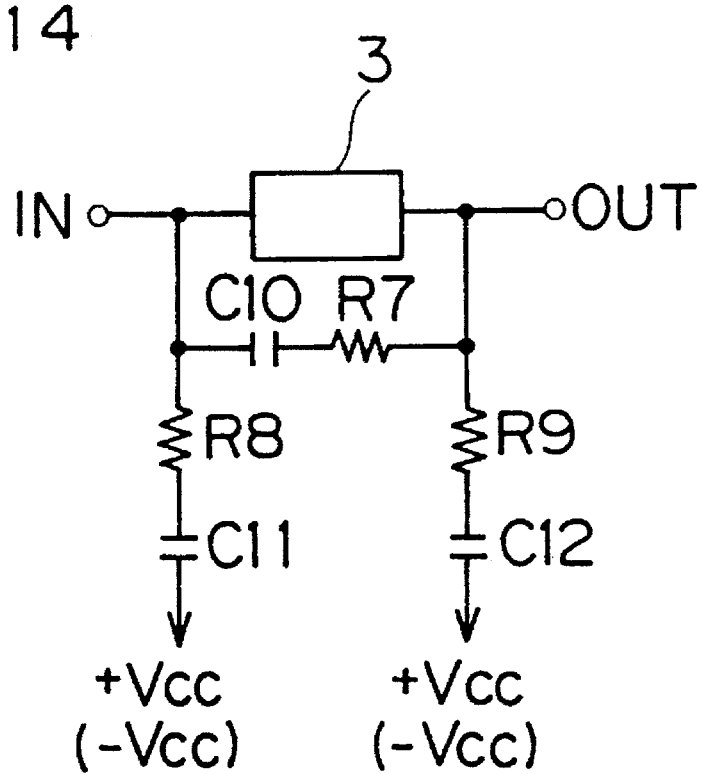
FIG. 14 is a circuit diagram showing a phase compensating circuit used in an operational amplifier according to a seventh embodiment.

Furthermore, a phase compensating circuit may be constructed by connecting a capacitor C10 and a resistor R7 in series between an input and an output of a buffer circuit 3, connecting a resistor R8 and a capacitor C11 in series between the input of the buffer circuit 3 and a positive power supply terminal or a negative power supply terminal, and connecting a resistor R9 and a capacitor C12 in series between the output of the buffer circuit 3 and the positive power supply terminal or the negative power supply terminal, as shown as a seventh embodiment in FIG. 14.

Figure 15:
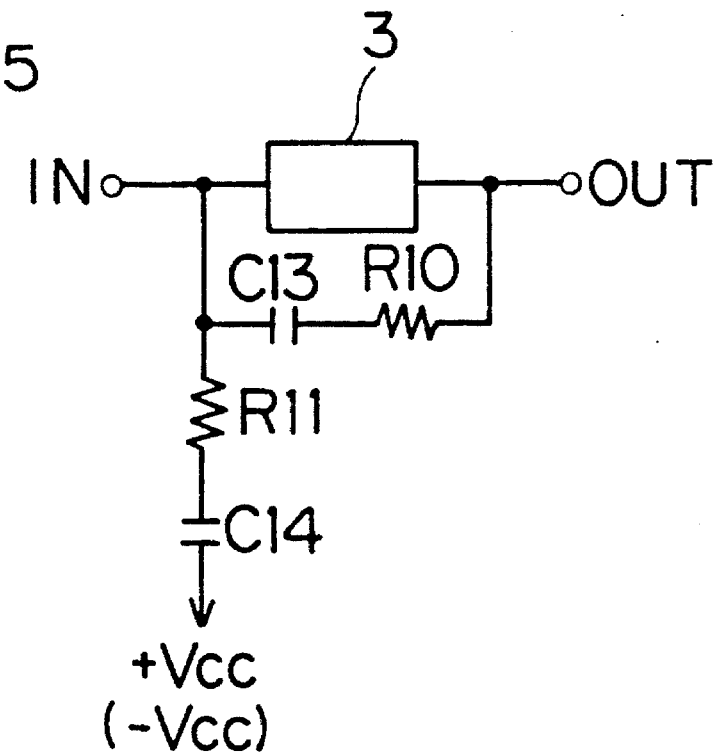
FIG. 15 is a circuit diagram showing a phase compensating circuit used in an operational amplifier according to an eighth embodiment.
Figure 16:
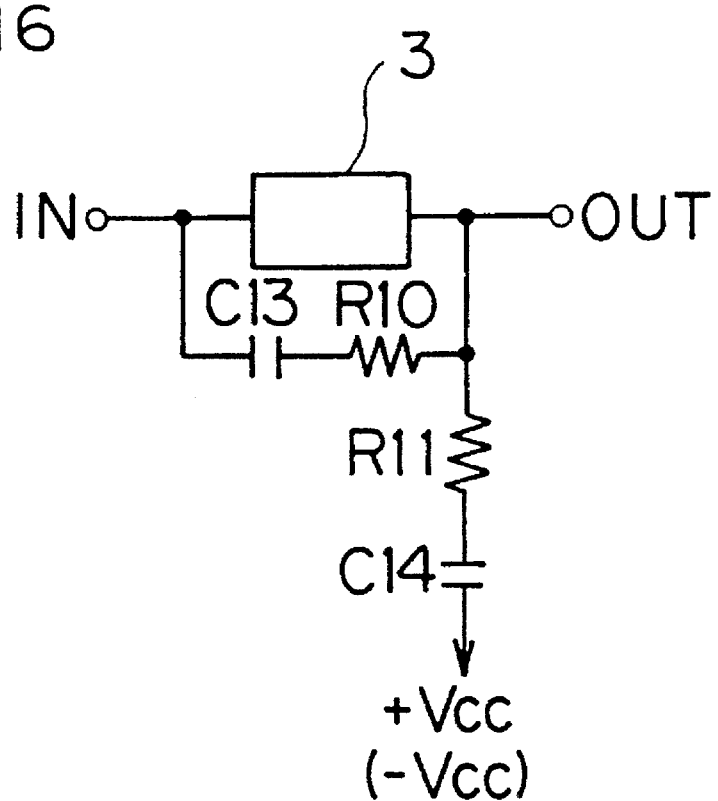
FIG. 16 is a circuit diagram showing a phase compensating circuit used in an operational amplifier according to a ninth embodiment.
Figure 17:
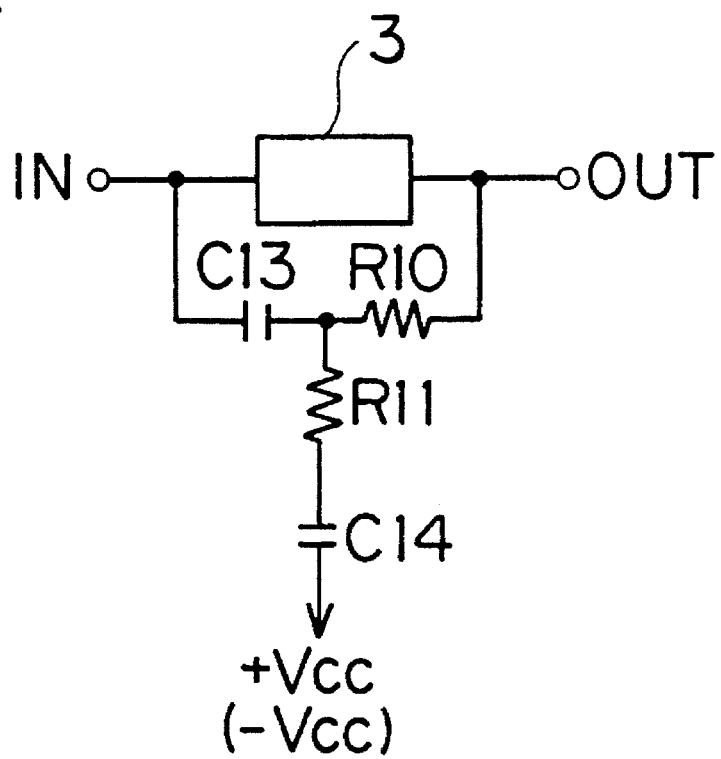
FIG. 17 is a circuit diagram showing a phase compensating circuit used in an operational amplifier according to a tenth embodiment.

Additionally, in a phase compensating circuit in which a capacitor C13 and a resistor R10 are connected in series between an input and an output of a buffer circuit 3, the phase compensating circuit may be constructed by connecting a resistor R11 and a capacitor C14 in series between the input of the buffer circuit 3 and a positive power supply terminal or a negative power supply terminal, connecting a resistor R11 and a capacitor C14 in series between the output of the buffer circuit 3 and a positive power supply terminal or a negative power supply terminal, or connecting a resistor R11 and a capacitor C14 in series between a node of the capacitor C13 and the resistor R10 and a positive power supply terminal or a negative power supply terminal, as shown as the eighth to tenth embodiments in FIGS. 15 to 17.

Figure 18:
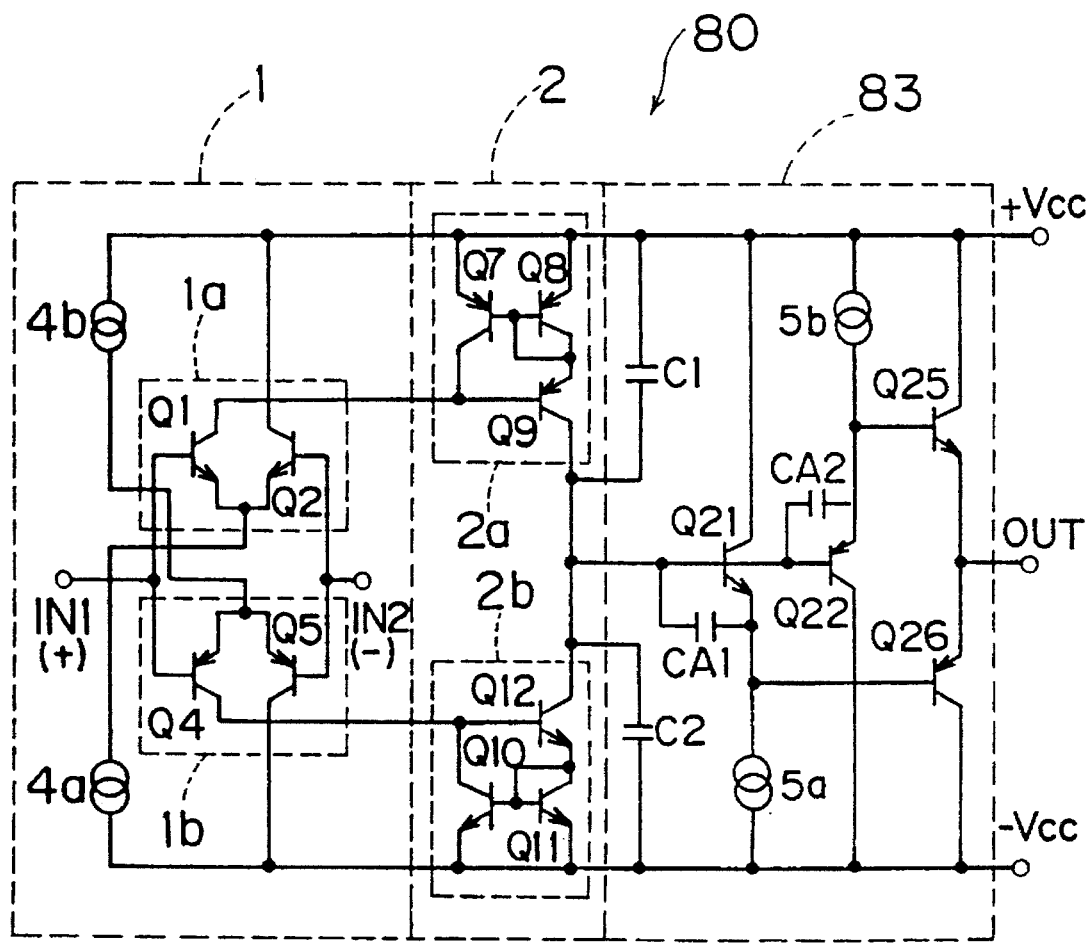
FIG. 18 is a circuit diagram for explaining an operational amplifier according to an eleventh embodiment of the present invention.

An operational amplifier according to the eleventh embodiment is shown in FIG. 18. In an operational amplifier 80 according to the present embodiment, a capacitor is connected to an input-stage transistor in a buffer circuit, thereby to achieve higher speed.

The present embodiment is characterized in that a current corresponding to the change in voltage at high speed in a transient region of an input waveform is caused to flow in the buffer circuit. Specifically, as shown in FIG. 18, the operational amplifier 80 has a differential amplifying stage 1, a current mirror stage 2 and a buffer circuit 83. The buffer circuit 83 is of approximately the same construction as the buffer circuit 13 shown in FIG. 2. However, capacitors CA1 and CA2 are connected between the bases and the emitters of input-stage transistors Q21 and Q22 in the buffer circuit 83.

In the operational amplifier 80, a current corresponding to the change in vol tape at high speed in the rise and the fall of the input waveform flows in output-stage transistors Q25 and Q26 in the buffer circuit 83, to improve the response characteristics of an output waveform to the input waveform.

Figure 19:
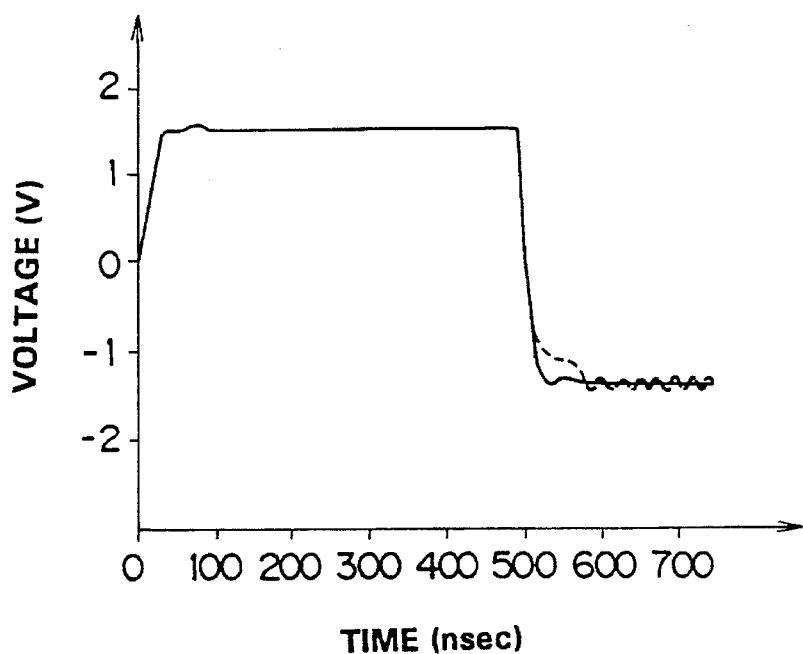
FIG. 19 is a diagram showing the waveform response characteristics of the operational amplifier according to the eleventh embodiment, where a solid line indicates the characteristics of the operational amplifier according to the present embodiment, and a broken line indicates the characteristics of the conventional operational amplifier.

In order to confirm the effect of the operational amplifier 80 according to the present embodiment, the waveform response characteristics in a case where the operational amplifier 20 in the conventional example (see FIG. 2) is used and a case where the operational amplifier 80 in the present embodiment is used are simulated using the circuit shown in FIG. 5. The results are shown in FIG. 19. As the conditions of the circuit shown in FIG. 5, a resistor $R_L$ of 2 kΩ and a capacitor $C_L$ of 10 pF are connected in parallel to each of outputs of the operational amplifiers 20 and 80, the power supply voltage Vcc is set to ±2.5 v, the operating current is set to 0.6 mA, and a rectangular wave of 3 Vpp at 1 MHz is applied to each of inputs of the operational amplifiers 20 and 80.

The characteristics shown in FIG. 19 are obtained by simulating the output waveform of the circuit shown in FIG. 5, where a solid line indicates the characteristics of the operational amplifier 80 in the present embodiment in which a capacitor of 5 pF is used as the capacitors CA1 and CA2, and a broken line indicates the characteristics of the operational amplifier 20 in the conventional example. As can be seen from the characteristics shown in FIG. 19, the fall time of the waveform in a fall portion in the operational amplifier 80 is shorter than that in the operational amplifier 20 in the conventional example. In addition, there can be seen no continuous vibration after the fall, which shows that the waveform distortion and the stability in the operational amplifier 80 are improved.

Figure 20:
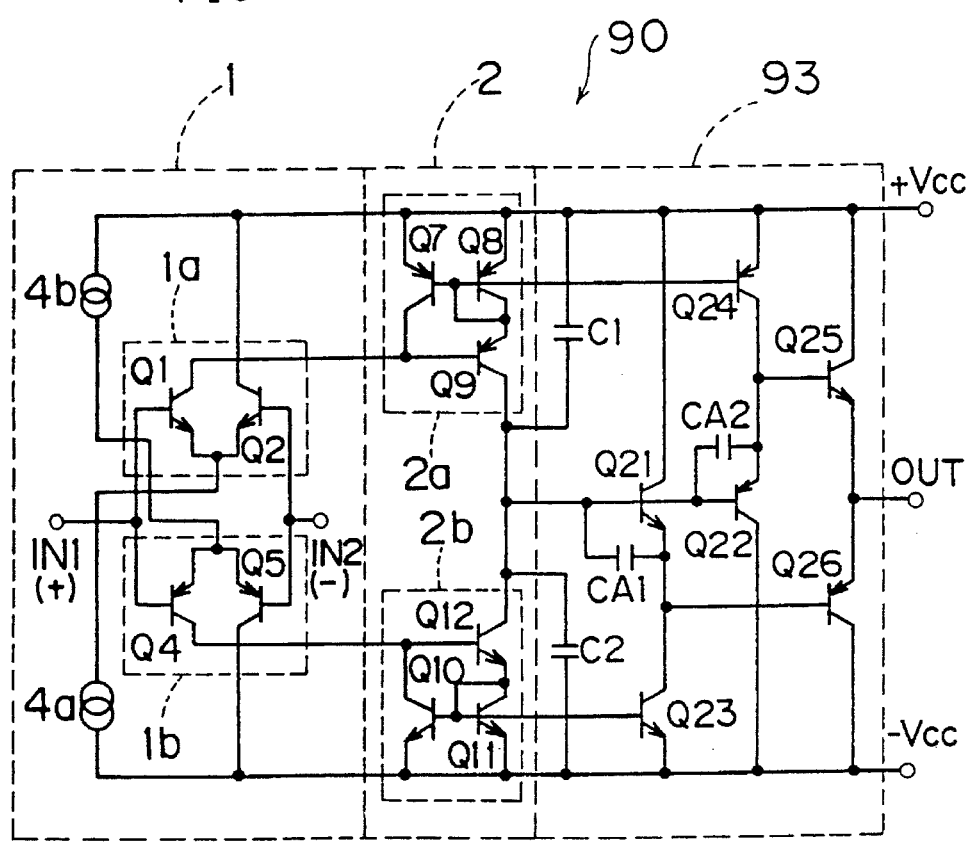
FIG. 20 is a circuit diagram showing an operational amplifier according to a twelfth embodiment of the present invention.

Furthermore, as shown in FIG. 20, an operational amplifier 90 may be constructed by connecting capacitors CA1 and CA2 between the bases and the emitters of input-stage transistors Q21 and Q22 in a buffer circuit 93, and connecting the collector of an NPN transistor Q23 in the buffer circuit 93 to a node of the emitter of the transistor Q21 and the base of a transistor Q26 in the buffer circuit 93, connecting the emitter thereof to a negative power supply terminal and the base thereof commonly connecting to the bases of transistors Q10 and Q11 in a second current mirror circuit 2b, and further connecting the collector of a PNP transistor Q24 in the buffer circuit 93 to a node of the emitter of the transistor Q22 and the base of a transistor Q25 in the buffer circuit 93, connecting the emitter thereof to a positive power supply terminal and the base thereof commonly connecting to the bases of transistors Q7 and Q8 in a first current mirror circuit 2a.

In the operational amplifier 90, the transistors Q23 and Q24 serve as current sources of the buffer circuit 93, operating currents of the transistors Q23 and Q24 are respectively controlled by the current mirror circuits 2a and 2b. The operational amplifier 90 supplies operating currents of the transistors Q21 and Q22 and base currents of the transistors Q25 and Q26 depending on the change in an input signal voltage, so that the effect of the operational amplifier 90 is overlapped with the effects of the capacitors CA1 and CA2, thereby to further improve the response characteristics of an output waveform to an input waveform.

As apparent from the foregoing description, the phase compensating circuits in the fifth to tenth embodiments can be constructed irrespective of the shape of the buffer circuit. Accordingly, an arbitrary buffer circuit according to the first to fourth embodiments, the circuit according to the eleventh or twelfth embodiment, and an arbitrary phase compensating circuit according to the fifth to tenth embodiments can be combined, and the combination is included in the scope of the present invention.

Figure 21:
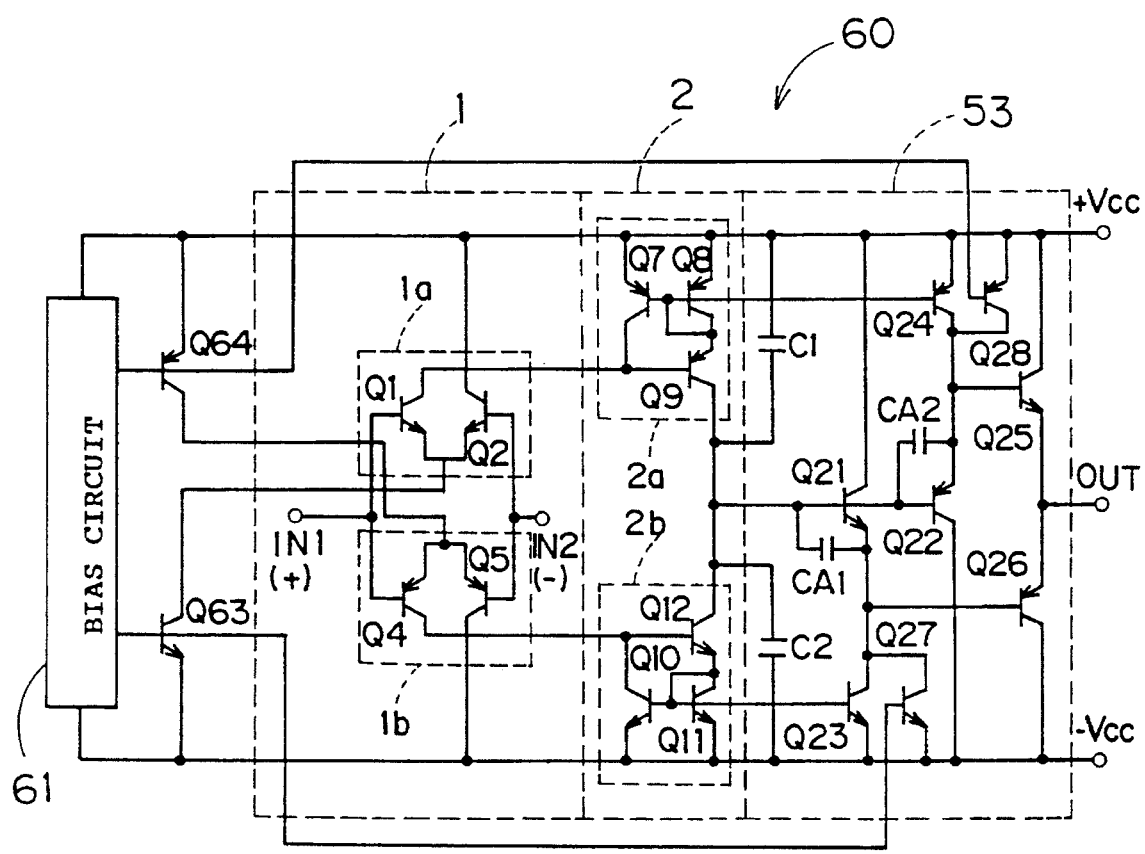
FIG. 21 is a circuit diagram showing an operational amplifier according to a thirteenth embodiment of the present invention.

Furthermore, the circuit arrangement in the eleventh or twelfth embodiment can be combined with the first to fourth embodiments. One of such examples is shown as a thirteenth embodiment in FIG. 21. In FIG. 21, the capacitors CA1 and CA2 for achieving higher speed shown in FIG. 18 are connected in the operational amplifier 60 shown in FIG. 9, thereby to increase the speed of the operational amplifier 60.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage feedback operational amplifier comprising:
   at least one pair of current mirror means; and
   a buffer circuit commonly connected to outputs of said at least one pair of current mirror means and having a first current source;
   a first capacitor and first and second resistors connected between an input and an output of said buffer circuit and connected in series with each other; and
   a second capacitor connected between a node of said first and second resistors and a power supply; wherein
   said first current source is electrically connected to one of said at least one pair of current mirror means so as to be controlled by only one operating current output from said one of said current mirror means.

2. The operational amplifier according to claim 1, further comprising:
   a pair of differential amplification means each having positive and negative input terminals, wherein each of said current mirror means is connected to one of said pair of differential amplification means so that outputs of said pair of differential amplification means are applied to a respective one of said current mirror means.

3. The operational amplifier according to claim 2, wherein said first current source comprises a pair of current sources and each of said current sources is connected to one of said current mirror means.

4. The operational amplifier according to claim 1, wherein said first current source comprises a transistor having a base terminal, an emitter terminal and a collector terminal, said base terminal of said transistor being connected to at least one of said current mirror means.

5. The operational amplifier according to claim 1, further comprising a second current source provided for said buffer circuit so as to supply a current to the buffer circuit, along with said first current source.

6. The operational amplifier according to claim 5, further comprising:
   a pair of differential amplification means each having positive and negative input terminals, wherein each of said current mirror means is connected to one of said pair of differential amplification means so that outputs of each of the pair of differential amplification means is applied to a respective one of said current mirror means.

7. The operational amplifier according to claim 5, wherein said second current source comprises a pair of current sources.

8. The operational amplifier according to claim 5, further comprising:
   a positive power supply terminal and a negative power supply terminal respectively connected to a positive power supply voltage and one of a negative power supply voltage and a ground potential, and a bias circuit connected between the positive power supply terminal and the negative power supply terminal, wherein
   said second current source includes means receiving an output of said bias circuit for controlling an operating current of said buffer circuit.

9. The operational amplifier according to claim 1, wherein said first current source is directly electrically connected to said one of said current mirror means so that no electrical components are connected between said first current source and said one of said current mirror means.

10. A voltage feedback operational amplifier comprising:
    a pair of current mirror means;
    a buffer circuit commonly connected to outputs of said pair of current mirror means, the buffer circuit having a first current source for controlling a current flowing in the buffer circuit and a second current source for supplying a current to the buffer circuit independently of the first current source, wherein said first current source and said second current source are each controlled by only one operating current output from a respective one of said pair of current mirror means;
    a first capacitor and a first resistor connected between an input and an output of said buffer circuit and connected in series with each other; and
    a series circuit connected between at least one of said input and said output of said buffer circuit and a power supply and having a second resistor and a second capacitor connected in series with each other.

11. The operational amplifier according to claim 10, further comprising:
    a pair of differential amplification means each having positive and negative input terminals, wherein each of said pair of current mirror means is connected to one of said pair of differential amplification means so that outputs of each of said pair of differential amplification means is applied to a respective one of said current mirror means.

12. The operational amplifier according to claim 10, further comprising:
    a positive power supply terminal connected to a positive power supply voltage and a negative power supply terminal connected to one of a negative power supply voltage and a ground potential, and a bias circuit connected between the positive power supply terminal and the negative power supply terminal, wherein
    at least one of said first and second current sources includes a current control circuit receiving an output of the bias circuit for controlling an operating current of said buffer circuit.

13. The operational amplifier according to claim 12, wherein said first current source is connected to one of said current mirror means so as to be controlled by operating currents of said one of said current mirror means, and the second current source has said current control circuit.

14. The operational amplifier according to claim 10, wherein said first current source is directly electrically connected to said one of said current mirror means so that no electrical components are connected between said first current source and said one of said current mirror means.

15. An operational amplifier comprising:

at least one pair of current mirror means;

a buffer circuit commonly connected to outputs of said at least one pair of current mirror means and having a first current source;

a first capacitor and first and second resistors connected between an input and an output of said buffer circuit;

said first resistor and said second resistor begin connected in series with each other through said first capacitor;

a second capacitor connected between a node of said first resistor and said first capacitor and a power supply; and a third resistor and a third capacitor connected in series with each other between a node of said first capacitor and said second resistor and said power supply; wherein said first current source is electrically connected to one of said at least one pair of current mirror means so as to be controlled by only one operating current output from said one of said current mirror means.

16. An operational amplifier comprising:

at least one pair of current mirror means;

a buffer circuit commonly connected to outputs of said at least one pair of current mirror means and having a first current source;

a first capacitor and a first resistor connected between an input and an output of said buffer circuit and connected in series with each other;

a series circuit connected between a node of said first capacitor and said first resistor and a power supply and having a second resistor and a second capacitor; wherein said first current source is electrically connected to one of said at least one pair of current mirror means so as to be controlled by only one operating current output from said one of said current mirror means.

17. An operational amplifier comprising:

a pair of differential amplification means each having positive and negative input terminals;

a pair of current mirror means connected to said pair of differential amplification means so that outputs of the differential amplification means are applied thereto;

a buffer circuit commonly connected to outputs of said pair of current mirror means;

a first capacitor and first and second resistors connected between an input and an output of said buffer circuit and connected in series with each other; and a second capacitor connected between a node of said first resistor and said second resistor and a power supply.

18. An operational amplifier comprising:

a pair of differential amplification means each having positive and negative input terminals;

a pair of current mirror means electrically connected to said pair of differential amplification means so that outputs of the differential amplification means are applied thereto;

a buffer circuit commonly connected to outputs of said pair of current mirror means;

first and second resistors and a first capacitor connected between an input and an output of said buffer circuit, said first resistor being connected in series with the second resistor through the first capacitor;

a second capacitor connected between a node of said first resistor and said first capacitor and a power supply; and a third resistor and a third capacitor connected between a node of said first capacitor and said second resistor and the power supply and connected in series with each other.

19. An operational amplifier comprising:

a pair of differential amplification means each having positive and negative input terminals;

a pair of current mirror means connected to said pair of differential amplification means so that outputs of the differential amplification means are applied thereto;

a buffer circuit commonly connected to outputs of said pair of current mirror means;

a first capacitor and a first resistor connected between an input and an output of said buffer circuit and connected in series with each other, and a series circuit connected between at least one of the input and the output of the buffer circuit and a power supply and having a second resistor and a second capacitor.

20. An operational amplifier comprising:

a pair of differential amplification means each having positive and negative input terminals;

a pair of current mirror means connected to said pair of differential amplification means so that outputs of the differential amplification means are applied thereto;

a buffer circuit commonly connected to outputs of said pair of current mirror means;

a first capacitor and a first resistor connected between an input and an output of said buffer circuit and connected in series with each other, and a series circuit connected between a node of the first capacitor and the first resistor and a power supply and having a second resistor and a second capacitor.

21. An operational amplifier comprising:

a pair of current mirror means;

a diamond-type buffer circuit commonly connected to outputs of said pair of current mirror means, said buffer circuit having in its input stage a transistor having an emitter terminal, a collector terminal and a base terminal; and a capacitor connected between the base terminal and the emitter terminal of said transistor.

22. The operational amplifier according to claim 21, wherein said buffer circuit further comprises a first current source, said first current source being connected to said current mirror means so as to be controlled by operating currents of said current mirror means.

23. The operational amplifier according to claim 22, wherein said buffer circuit further comprises a second current source provided so as to supply a current to the buffer circuit.

24. The operational amplifier according to claim 23, further comprising a pair of differential amplification means each having positive and negative input terminals, said current mirror means being respectively connected to said differential amplification means so that outputs of the pair of differential amplification means are applied thereto.

25. The operational amplifier according to claim 22, further comprising a pair of differential amplification means each having positive and negative input terminals, said current mirror means being respectively connected to said differential amplification means so that outputs of the pair of differential amplification means are applied thereto.

26. The operational amplifier according to claim 21, wherein said buffer circuit further comprises a current source provided so as to supply a current to the buffer circuit.

* * * * *